United States Patent [19]

Miles

[11] Patent Number: 4,517,523

[45] Date of Patent: May 14, 1985

[54] OSCILLOSCOPE TRIGGER CIRCUIT COMBINING WIDEBAND TRIGGER SIGNAL AMPLIFICATION AND TRIGGER COUPLING MODE SELECTION

[75] Inventor: Frank Miles, Ann Arbor, Mich.

[73] Assignee: Tektronix, Inc., Beaverton, Oreg.

[21] Appl. No.: 538,244

[22] Filed: Oct. 3, 1983

[30] Foreign Application Priority Data

Oct. 22, 1982 [JP] Japan ................................ 57-184779

[51] Int. Cl.³ .............................................. H03F 3/68
[52] U.S. Cl. .................................... 330/126; 330/151; 330/295; 330/84
[58] Field of Search ................... 330/51, 84, 126, 151, 330/295; 328/152; 455/179, 187, 191, 198

[56] References Cited

U.S. PATENT DOCUMENTS 4,368,435  1/1983  Bloy ................................ 330/126 X
4,418,428  11/1983  Evans ............................. 455/191 X

*Primary Examiner*—James B. Mullins
*Assistant Examiner*—Steven J. Mottola
*Attorney, Agent, or Firm*—George T. Noe

[57] ABSTRACT

A trigger circuit for use in an oscilloscope comprises a DC amplifier for low frequency amplification and high-frequency amplifier arranged to provide wideband trigger signal amplification while providing typical trigger coupling modes, such as AC, DC, high-frequency reject, and low-frequency reject.

1 Claim, 6 Drawing Figures

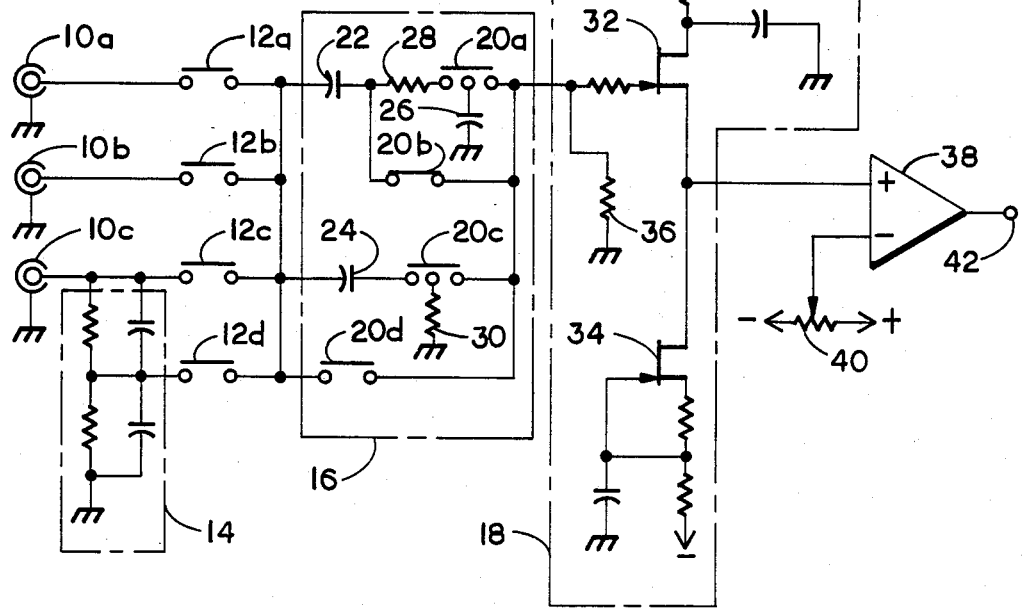
Fig_1. (PRIOR ART)
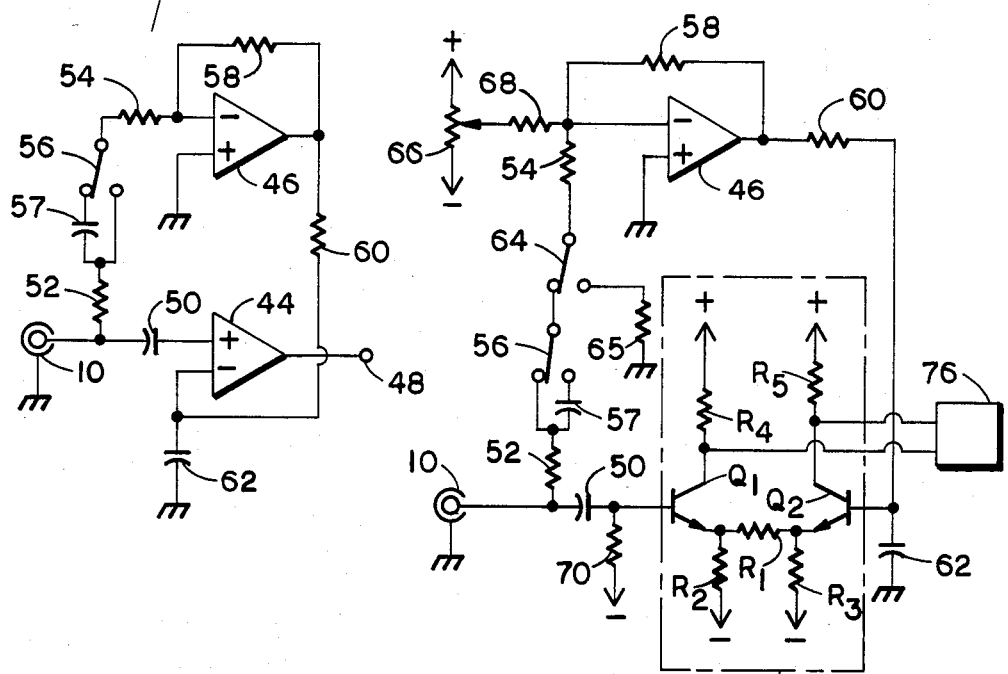
Fig_2.
Fig_3.

OSCILLOSCOPE TRIGGER CIRCUIT COMBINING WIDEBAND TRIGGER SIGNAL AMPLIFICATION AND TRIGGER COUPLING MODE SELECTION

BACKGROUND OF THE INVENTION

This invention relates generally to trigger circuits, and more particularly to a circuit for controlling the frequency and gain characteristics of the trigger signal.

Various trigger circuits are widely utilized for operation of triggerable elements or circuits such as, for example, sweep ramp generators of oscilloscopes. To provide versatility of such instruments, trigger circuits usually include a trigger coupling circuit for selecting the desired frequency response or signal attenuation.

One example of a conventional trigger circuit is shown in FIG. 1. In this particular example, three triggering signals, which suitably, may represent channel 1 (CH 1) and channel 2 (CH 2) input signals to a dual channel oscilloscope and an external (EXT) triggering signal, are applied to input connectors 10a through 10c. Any one of such trigger signals is selected by selection switch 12a through 12d for selecting alternatively any one of the CH 1, CH 2, EXT or EXT trigger signals divided by RC attenuator 14. The selected trigger signal is, then, supplied to the input of input amplifier 18 by way of coupling circuit 16 including four switches 20a through 20d, capacitors 22 through 26 and resistors 28 and 30. Switches 20a through 20d select respectively high frequency reject (HF REJ), AC coupling (AC), low frequency reject (LF REJ) and DC coupling (DC) modes. Input attenuator 18 includes source follower field effect transistor (FET) 32, current source FET 34 and input resistor 36. The output of input amplifier 18 is then compared with controllable trigger level from potentiometer 40 by differential comparator 38 to provide an output trigger signal from output terminal 42.

In operation, attenuator 14 attenuates the EXT trigger signal, for example, by the factor of 10 over the entire frequency range. AC coupling capacitor 22 has a relatively large capacitance, e.g. 0.027 µF to eliminate DC and very low frequency signal components when the AC coupling mode to chosen. When switch 20a is closed to choose HF REJ coupling mode, resistor 28 and capacitor 26 form a low pass filter with upper cut-off frequency of about 30 KHz. Capacitor 24 is a very small capacitance, e.g. 100 PF, to reject low frequency components up to about 50 KHz.

Disadvantages of such prior art trigger circuits include the use of many switches in series with the high frequency signal paths, thereby making the circuit arrangement very critical to high frequency operation, especially when implemented in integrated circuit form. In this example, the DC, AC and LF REJ paths must be high frequency signal paths over the entire bandwidth (100 MHz or higher).

It is therefore, a feature of this invention to provide an improved trigger circuit including both high and low frequency signal amplifiers.

It is another feature of this invention to provide a trigger circuit having fewer high frequency signal paths.

It is still another feature of this invention to provide a trigger circuit capable of selecting various trigger coupling frequency responses without using a large coupling capacitor in series with the high frequency signal path.

It is an additional feature of this invention to provide a trigger circuit capable of attenuating the input trigger signal.

These and other features as well as advantages and operation of this invention will become apparent to one skilled in the art upon a reading of the following description when taken in conjunction with the accompanying drawings.

DRAWINGS

FIG. 1 is a circuit schematic of a prior art trigger circuit;

FIG. 2 is a circuit schematic of one preferred embodiment of the present invention;

FIG. 3 is a circuit schematic of the embodiment of FIG. 2 in a practical application;

DETAILED DESCRIPTION OF THE INVENTION

Figure 4:
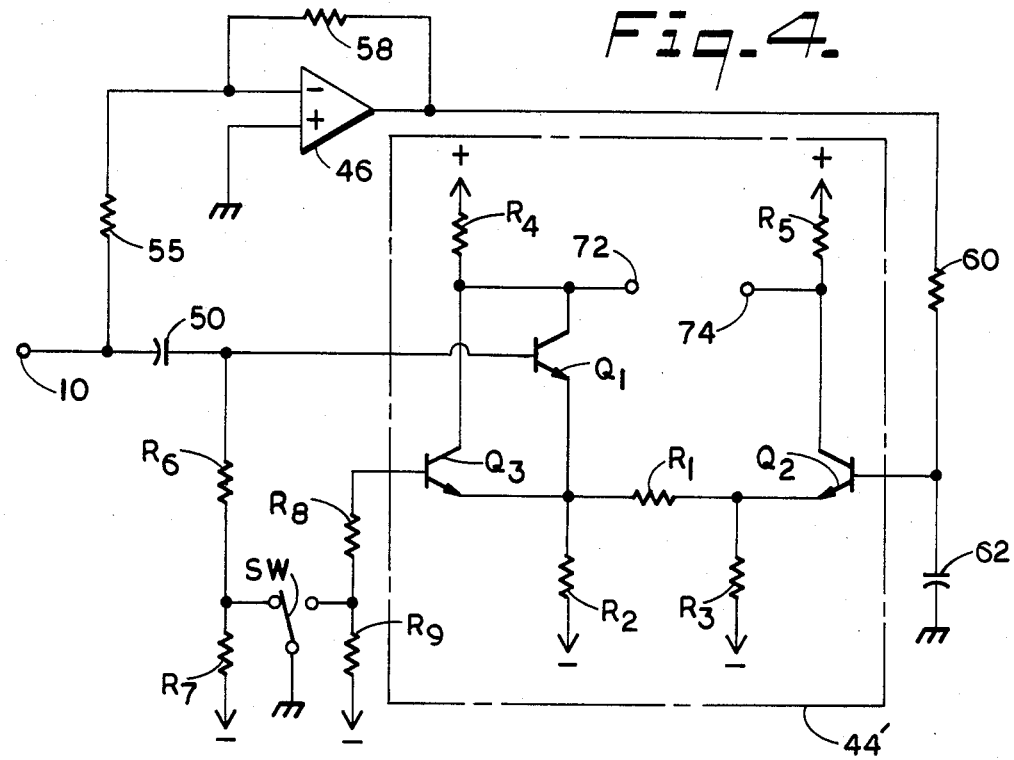
FIG. 4 shows the details of the high-frequency amplifier portion configured for HF REJ mode of operation.

FIG. 2 is a simplified schematic of one embodiment of the trigger circuit capable of selective frequency response. Applied to input connector 10 is an input trigger signal, high frequency components of which are amplified by high frequency differential amplifier 44 through coupling capacitor 50 of relatively low capacitance, e.g. 0.002 µF, and low frequency components of which are amplified by low frequency operational amplifier 46. The signal coupling to low frequency amplifier 46 including feedback resistor 58 is made by input resistors 52 and 54 and switch 56. Switch 56 is employed to choose either DC or AC coupling mode in this simplified circuit. Large coupling capacitor 57, e.g. 1 µF, is inserted between resistors 52 and 54 in the AC coupling mode for DC blocking purpose. Resistor 52 is used to isolate capacitor 57 from the high frequency signal path, thereby avoiding large stray capacitance. The output of low frequency amplifier 46 is coupled to the inverting input of high frequency amplifier 44 through a low pass filter comprising resistor 60 and capacitor 62. The overall output is derived from output terminal 48.

In operation, when the DC coupling mode is selected by mode switch 56, high frequency signal components of the input signal passed through high frequency coupling capacitor 50 are amplified by differential amplifier 44 with its predetermined gain. Low frequency components are amplified by operational amplifier 46 with a unity gain determined by R 58/(R 52+R 54), where R 52, R 54 and R 58 are respectively resistance of resistors 52, 54 and 58. In one preferred embodiment, R 52+R 54=R 58=10K. Since the signal polarity of the output from operational amplifier 46 is inverted with respect to the input signal, the output connection to the inverted input of differential amplifier 44 causes amplifier 44 to operate as an adder. When the AC coupling mode is selected, DC and very low frequency signal components are prevented from reaching the low frequency operational amplifier. A controllable trigger level may be added to the input of operational amplifier 46 so that differential amplifier 44 also acts as a trigger level comparator. Such trigger level may be independent of the input trigger signal or dependent thereon such as a controllable fraction of the peak-to-peak amplitude of the input trigger signal.

FIG. 3 is a circuit schematic of a practical trigger circuit applying the principle of the circuit of FIG. 2. High frequency differential amplifier 44 comprises a pair of transistors $Q_1$-$Q_2$, the emitters of which are coupled together through coupling resistor $R_1$ and each of which is connected to a negative voltage source through a respective resistor $R_2$ and $R_3$. The collectors of transistors $Q_1$ and $Q_2$ are connected to a positive voltage source through respective collector resistors $R_4$ and $R_5$. The collector outputs of transistors $Q_1$-$Q_2$ are supplied to utilization circuit 76, which may be, for example, a triggerable ramp generator driven by a fast pulse generator. The base of transistor $Q_1$ is returned to a negative bias voltage source through a resistor 70. Input coupling to low frequency amplifier 46 is slightly different from FIG. 2 in the addition of additional switch 64 and resistor 65 for the LF REJ coupling mode. A trigger level control voltage from potentiometer 66 is also coupled through resistor 68 to the inverting input of operational amplifier 46.

When switch 64 is switched to the right position, the lower end of input resistor 54 is returned to ground through resistor 65 having essentially the same resistance as resistor 52, thereby disconnecting the input signal to operational amplifier 46 which now operates as a buffer amplifier for controllable trigger level from potentiometer 66. FIG. 4 shows the details of high-frequency differential amplifier 44 configured as amplifier 44' to permit selection of the HF REJ mode in addition to normally passing the high-frequency component of the triggering signal. Amplifier 44' includes an additional transistor $Q_3$ connected across transistor $Q_1$ (collector to collector and emitter to emitter). The base of transistor $Q_1$ is connected to the output side of capacitor 50 to receive high-frequency signals, and is also connected to a negative-voltage bias source via series-connected resistors $R_6$ and $R_7$. The base of transistor $Q_3$ is connected to the negative-voltage bias source via series-connected resistors $R_8$ and $R_9$. For normal operation, that is, when high-frequency signals are to be passed, a switch SW is in its left-hand position, grounding the junction of resistors $R_6$ and $R_7$. Transistor $Q_1$, with a more positive voltage on its base than transistor $Q_3$ has, is turned on while transistor $Q_3$ is reversed biased and therefore off.

When it is desired to attenuate the high-frequency signals (HF REJ mode), switch SW is moved to the right-hand position, grounding the junction of resistors $R_8$ and $R_9$. This, of course, reverse biases transistor $Q_1$ and turns transistor $Q_3$ on. Transistor $Q_3$ maintains the balance of currents in amplifier 44' while transistor $Q_1$ is off, blocking the high-frequency signal.

Figure 5:
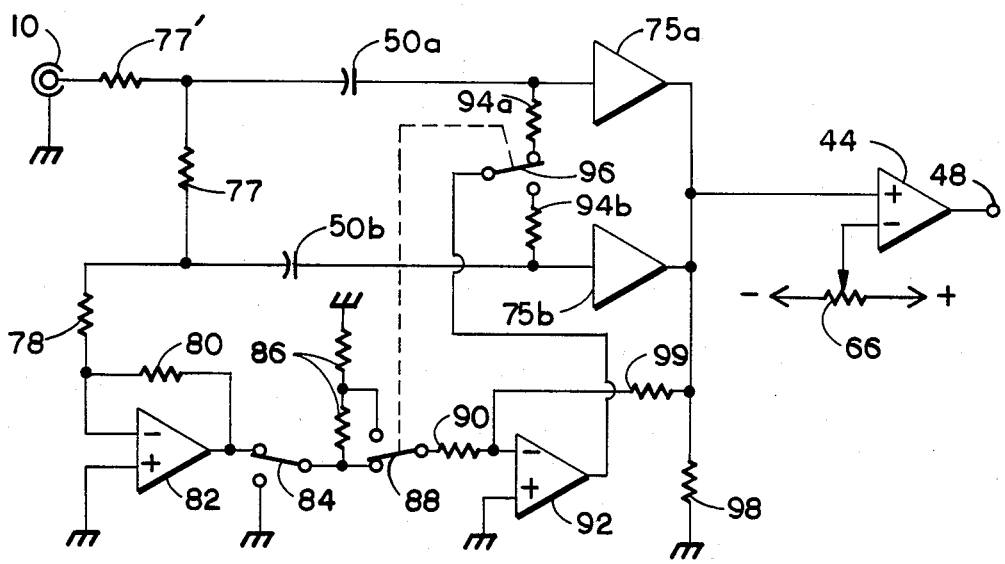
FIG. 5 is a circuit schmatic of an alternative embodiment of the present invention.

FIG. 5 is a simplified schematic of another embodiment of the trigger circuit according to this invention capable of varying the attenuation factor of the input trigger signal. This embodiment is particularly useful as an external trigger circuit. An input signal applied to input connector 10 is coupled through input resistor 77' and high frequency coupling capacitor 50a to first impedance converter amplifier 75a. Similarly, the signal at the junction of resistor 77' and capacitor 50a is coupled through resistor 77 and capacitor 50b to second impedance converter amplifier 75b. The junction voltage of resistor 77 and capacitor 50b is further coupled to an inverting amplifier comprising operational amplifier 82, input resistor 78 and feedback resistor 80. Coupled to the output of operational amplifier 82 is coupling selection switch 84, resistive divider 86, switch 88 and input resistor 90 to operational amplifier 92. The output of operational amplifier 92 is coupled selectively to either one of amplifiers 75a or 75b through switch 96 and large resistor 94a or 94b, respectively. The outputs of amplifiers 75a and 75b are connected together and fed back to the inverting input of amplifier 92 through feedback resistor 99 and also coupled to the input of differential comparator 44.

In operation, preferably ganged switches 88 and 96 are in the shown position for trigger coupling with minimum attenuation. That is, the input trigger signal at terminal 10 is coupled to now energized high frequency amplifier 75a through resistive attenuator comprising resistors 77', 77 and 78 and also coupling capacitor 50a. It should be noted that the inverting input of low frequency operational amplifier 82 is a virtual ground and that the attenuation factor is determined by R 77'/(R 77'+R 77+R 78), where R 77', R 77 and R 78 are the resistances of resistors 77', 77 and 78, respectively. Second high frequency amplifier 75b is inoperative under this condition. When the DC coupling mode is selected, switch 84 is in the shown position. By proper selection of feedback resistor 80, or R 80=R 77+R 78, the output from amplifier 82 is essentially equal in amplitude to the high frequency signal at the input of amplifier 75a. Both high and low signal components are combined at the input of amplifier 75a to develop a wideband output voltage across output resistor 98. Such output voltage is summed at the inverting input of operational amplifier 92 and any error is then fed to amplifier 75a after sufficient amplification by error amplifier 92. The feedback arrangement helps to stabilize the circuit operation.

The attenuated operation will result when switching both switches 88 and 96 to their other positions. Second high frequency amplifier 75b is then energized and the output signal of amplifier 82 is also attenuated by resistive divider 86. The high frequency components to amplifier 75b are attenuated by the factor of R 78/(R 77'+R 77+R 78). Resistive divider 86 is also designed to attenuate the low frequency components to the same amount by proper selection of circuit parameters. The other circuits operate essentially the same and in turn provide the attenuated wideband trigger output signal across resistor 98. Circuit parameters are chosen such that the attenuation ratio is reduced to a given factor (e.g. 10) when switches 88 and 96 are switched between the two positions.

For the AC coupling mode, switch 84 is returned to ground to disconnect the DC components. Only AC components are amplified in this coupling mode. It should be noted that amplifier 92 is used even in this mode to stabilize the circuit operation. An electronic switch may also be employed across feedback resistor 80 of operational amplifier 82 to short-circuit such resistor in the AC coupling mode, thereby reducing the gain to zero.

Figure 6:
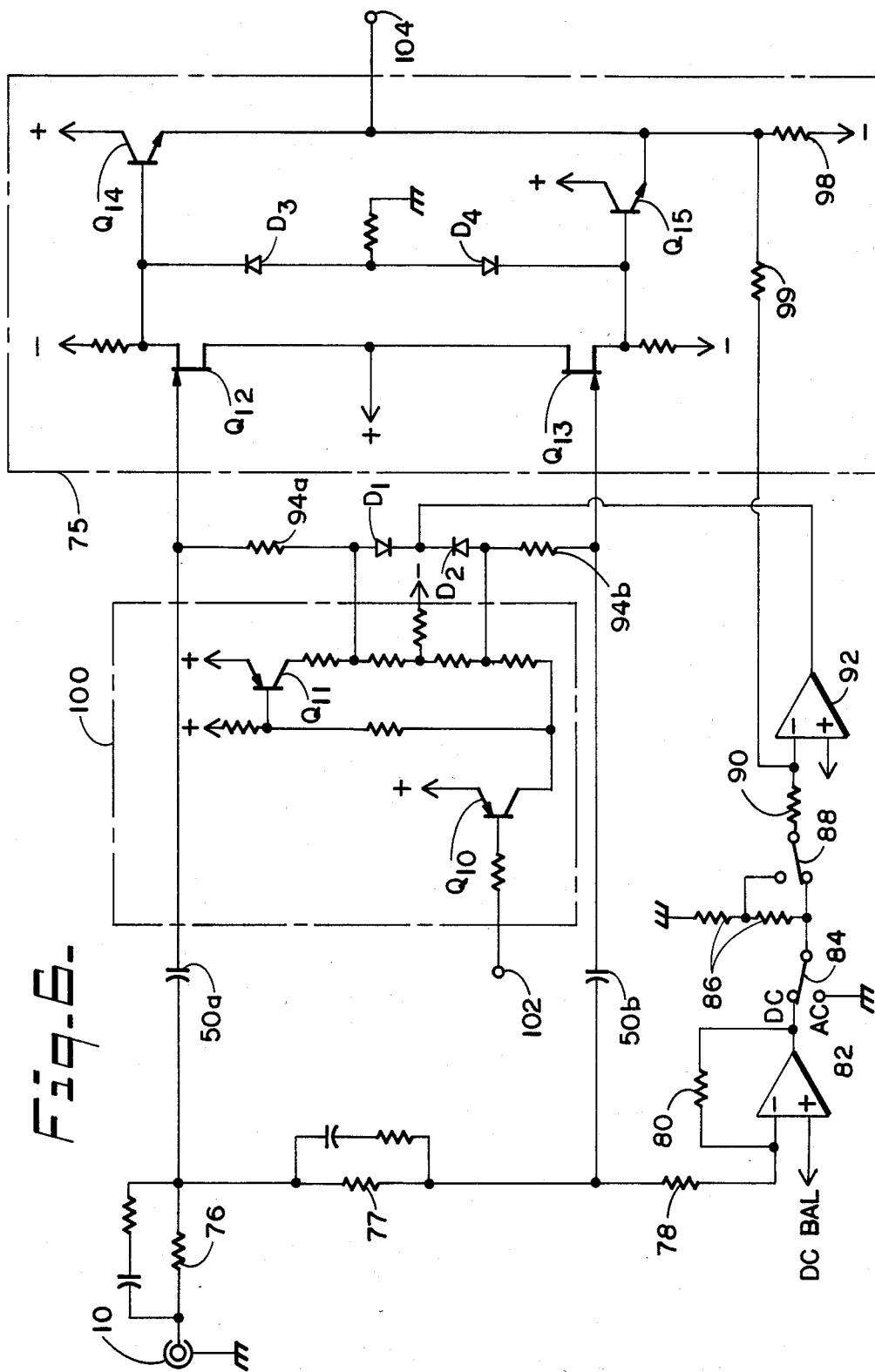
FIG. 6 is a circuit schematic of the embodiment of FIG. 5 in a practical application.

FIG. 6 is a circuit schematic of a practical trigger circuit embodying the principle of the circuit of FIG. 5. Since the circuit arrangement and operation are similar to that of FIG. 5, only the differences are discussed hereunder.

Resistors 76, 77 and 78 are respectively 825 KΩ, 158. KΩ and 17.4 KΩ and capacitors 50a and 50b are 180 PF in a particular embodiment. To provide a wideband attenuator, resistors 76 and 77 are each paralleled by capacitors, which is well-known in the art. High frequency amplifier 75 comprises source follower FETs $Q_{12}$, $Q_{13}$ as the input stage, emitter follower transistors $Q_{14}$-$Q_{15}$ as the output stage, and protection diodes $D_3$-$D_4$ therebetween. Switch 96 in FIG. 5 is substituted by diodes $D_1$-$D_2$ controlled by switch control circuit 100 including two transistors $Q_{10}$-$Q_{11}$. A switch control signal is applied from control terminal 102 to the base of a transistor $Q_{10}$.

When the switch control signal is low, transistor $Q_{10}$ turns on and transistor $Q_{11}$ turns off, which turns on diode $D_2$ and FET $Q_{13}$ but turns off diode $D_1$ and FET $Q_{12}$. When the control signal is high, a different attenuation mode is selected to energize diode $D_1$ and FET $Q_{12}$, thereby amplifying the input signal with a different attenuation factor.

Although the present invention is described hereinabove with respect to two preferred embodiments, it is understood that the number of required high frequency signal paths is reduced over the prior art and that no large capacitance coupling capacitor is coupled to the high frequency signal path. In addition, any switch can be removed from the high frequency signal path, thereby enabling the circuit to adapt electronic or remote control.

It should be understood that various modifications can be made without departing from the broad aspects of this invention.

What I claim as being novel is:

1. A wideband trigger circuit for an oscilloscope, comprising:
   an input terminal for receiving an input signal;
   an input impedance network including at least one DC signal path connected to said input terminal for providing a plurality of selectable input signal coupling modes;
   a low frequency amplifier coupled to said impedance network for amplifying low frequency components of said input signal;
   a high frquency amplifier having a first input AC coupled to said input terminal and a second input coupled to the output of said low frequency amplifier for amplifying high frequency components of said input signal and for adding the low and high frequency components; and
   means for selecting any one of said plurality of selectable input signal coupling modes thereby to establish the frequency response of said trigger circuit.

* * * * *